(12) United States Patent
Gradtke et al.

(10) Patent No.: US 8,784,121 B2
(45) Date of Patent: Jul. 22, 2014

(54) CONTROL DEVICE FOR A MOTOR VEHICLE AND RELATED METHOD FOR MOUNTING A CONTROL DEVICE FOR A MOTOR VEHICLE

(75) Inventors: Oliver Gradtke, Reutlingen (DE); Walter Roethlingshoefer, Reutlingen (DE); Christian Luckner, Leonberg (DE)

(73) Assignee: Robert Bosch GmbH, Stuttgart (DE)

(*) Notice: Subject to any disclaimer, the term of this patent is extended or adjusted under 35 U.S.C. 154(b) by 124 days.

(21) Appl. No.: 13/516,287

(22) PCT Filed: Dec. 10, 2010

(86) PCT No.: PCT/EP2010/069401
§ 371 (c)(1),
(2), (4) Date: Jun. 15, 2012

(87) PCT Pub. No.: WO2011/082947
PCT Pub. Date: Jul. 14, 2011

(65) Prior Publication Data
US 2012/0262882 A1    Oct. 18, 2012

(30) Foreign Application Priority Data
Dec. 16, 2009   (DE) .......................... 10 2009 054 770

(51) Int. Cl.
*H01R 12/00*   (2006.01)
(52) U.S. Cl.
USPC ................. 439/76.1; 439/76.2; 439/540.1
(58) Field of Classification Search
USPC ................ 439/76.1, 76.2, 540.1; 361/752
See application file for complete search history.

(56) References Cited

U.S. PATENT DOCUMENTS 3,780,431 A     12/1973   Feeney
5,323,296 A  *   6/1994   Gasser et al. ................. 361/736
(Continued)

FOREIGN PATENT DOCUMENTS

CH       504829     3/1971
DE       1231322   12/1966
(Continued)

OTHER PUBLICATIONS

PCT/EP2010/069401 International Search Report.

*Primary Examiner* — Hien Vu
(74) *Attorney, Agent, or Firm* — Michael Best & Friedrich LLP

(57) ABSTRACT

The invention relates to a control device (1) for a motor vehicle, comprising a housing (10) and at least one circuit carrier (20), which is arranged in an inner chamber of the housing (10) and comprises at least one first contact element (22) that establishes an electric connection to at least one second contact element (17) of a plug receptacle (50) on at least one housing wall (11), wherein the second contact element (17) is guided through the at least one housing wall (11) and is designed on the inside as a contact spring that rests against an associated first contact element (22) by spring force, and to a related method for mounting a control device for a motor vehicle. According to the invention, the at least one housing wall (11) comprises receiving means (11.1) for a first circuit carrier (20), wherein the first circuit carrier (20) is guided through guide means (13.1) designed in the housing (10), wherein the guide means (13.1) and/or the receiving means (11.1) form a mechanical stop (19) for the first circuit carrier (20) that is designed such that the position of the first circuit carrier (20) is fixed in the mechanical stop (19) with sufficiently small tolerance such that the electric connection between the at least one first contact element (22) of the first circuit carrier (20) and the corresponding second contact element (17) designed as a contact spring is established in the plug receptacle (50).

10 Claims, 4 Drawing Sheets

(56) References Cited

U.S. PATENT DOCUMENTS

| | | | |
|---|---|---|---|
| 5,774,342 A * | 6/1998 | Brandenburg et al. | 361/774 |
| 6,178,094 B1 * | 1/2001 | Hakozaki | 361/796 |
| 6,276,943 B1 * | 8/2001 | Boutros et al. | 439/76.1 |
| 6,802,721 B2 * | 10/2004 | Sanada et al. | 439/67 |
| 7,056,132 B1 * | 6/2006 | Berglund et al. | 439/76.1 |
| 7,140,885 B2 * | 11/2006 | Kitamura | 439/76.1 |
| 7,417,868 B2 | 8/2008 | Morisada | |

FOREIGN PATENT DOCUMENTS

| | | |
|---|---|---|
| DE | 10162405 | 7/2003 |
| DE | 10159063 | 8/2003 |
| DE | 102005007931 | 8/2006 |
| DE | 102006025977 | 12/2007 |
| JP | 08177518 | 7/1996 |
| JP | 08185920 | 7/1996 |
| JP | 2000182694 | 6/2000 |
| WO | 2005075253 | 8/2005 |

* cited by examiner

CONTROL DEVICE FOR A MOTOR VEHICLE AND RELATED METHOD FOR MOUNTING A CONTROL DEVICE FOR A MOTOR VEHICLE

BACKGROUND OF THE INVENTION

The invention is based on a control device for a motor and on a corresponding method for mounting a control device of this type for a motor.

As a rule, ceramic circuit carriers and ceramic substrates in electronic control devices for motor vehicles are currently contact-connected electrically to punched grids by wire connections which are bonded by ultrasound and are also referred to as bonds. The punched grids in turn produce the electric connections to connecting pins of customer plugs and to separate components, for example electrolytic capacitors, power semiconductors, coils etc. The electric connection of the ceramic substrate to the punched grid by means of bonds constitutes a sequential manufacturing process which leads to increased net product costs both with regard to the cycle time, i.e. the processing duration until all of the bonds are set, and also to the investments for the bonds.

Laid-open application DE 10 2006 025 977 B4, for example, describes a control device with a circuit carrier with a contact connection on the end side. The control device described comprises a board-shaped circuit carrier which is fastened in an interior space of a housing by means of fastening means, and a plug part which is formed on a wall of the housing and has plug contact parts which are each electrically connected to associated conductor tracks on the circuit carrier. In this case, contact surfaces are formed on the end side of the circuit carrier, and the plug contact parts are guided through the wall of the housing and, on the inside, are each designed as contact springs which bear against associated contact surfaces by means of spring force.

SUMMARY OF THE INVENTION

By contrast, the control device according to the invention has the advantage that the at least one housing wall, through which at least one second contact element is guided, has receiving means for a first circuit carrier, the first circuit carrier being arranged in an interior space of the housing, having at least one first contact element and being guided by guide means which are arranged, for example, on two opposite housing walls. In this case, the guide means and/or the receiving means form a mechanical stop which is designed in such a manner that the position of the first circuit carrier in the mechanical stop is fixed with a sufficiently small tolerance such that the electric connection is produced between the at least one first contact element of the first circuit carrier and the corresponding second contact element of the plug receptacle, which second contact element is designed as a contact spring. The control device according to the invention advantageously makes it possible for the at least one circuit carrier to be electrically connected to the outside to a cable harness or to another control device by means of cost-effective contacting technology and internally to separate components.

By contrast, the method according to the invention for mounting a control device of this type for a motor vehicle has the advantage that the first circuit carrier, guided in guide means which are arranged, for example, on two opposite housing walls, is pushed into a first housing part as far as a mechanical stop, the mechanical stop for the first circuit carrier being formed by receiving means provided in the at least one housing wall and/or by the guide means. In this case, the position of the first circuit carrier in the mechanical stop is fixed with a sufficiently small tolerance such that the electric connection is produced between the at least one first contact element and the corresponding second contact element, which is designed as a contact spring. This advantageously permits a cost-saving contact connection of the circuit carrier within the course of the joining of the components, giving rise to short cycle times for the contact connection.

Embodiments of the present invention advantageously permit a saving on the investments for wire connections or bonds. In addition, a modular construction capability of the system with respect to different circuit carrier sizes, thermal requirements and different customer plugs is advantageously produced.

It is particularly advantageous that the guide means are designed as guide grooves which are each provided in a housing wall in such a manner that a tapered portion arises in the region upstream of the at least one second contact element, which is designed as a contact spring. The guide grooves can advantageously be provided simply and rapidly in the corresponding housing walls. The circuit carrier, which is manufactured, for example, from a ceramic substrate, can therefore be pushed in, guided in the guide grooves of the housing, which is manufactured, for example, from plastic, and, in the mechanical stop, can be connected to the customer plug via spring contacts which are injected into the plastics material of the housing. The respective tapered portion of the guide grooves in the region upstream of the spring contacts on the mechanical stop is designed in such a manner that the lateral position of the circuit carrier is fixed with a sufficiently small tolerance in order to strike against the spring contacts.

In a refinement of the control device according to the invention, a second circuit carrier is guided in the guide means downstream of the first circuit carrier, at least one third contact element, which is designed as a contact spring, being arranged on the second circuit carrier and producing an electric connection to at least one corresponding fourth contact element of the first circuit carrier. In this case, the second circuit carrier can carry, for example, at least one separate component, for example an electrolytic capacitor, a power semiconductor, a coil, etc., which is intended to be connected electrically to the electronic circuit arranged on the first circuit carrier. In addition, the second circuit carrier can be designed as part of a second housing part which is intended to be joined to a first housing part, into which the first circuit carrier is pushed.

In a further refinement of the control device according to the invention, the at least one first contact element and/or the at least one fourth contact element are/is designed as contact surfaces which are arranged on the surface of the at least one circuit carrier and/or on the outer edge of the at least one circuit carrier. The design of the first and/or fourth contact elements as contact surfaces permits a cost-saving contact connection of the first circuit carrier. Use of the outer edge of the first circuit carrier advantageously enables the contact connection of the first circuit carrier without using up the contacting surface on the circuit carrier. The first and/or fourth contact elements, which are arranged on the outer edge and are designed as contact surfaces, can be formed by metallically filled vias which are arranged on a large substrate in such a manner that they can be divided when singulating the first circuit carriers from the large substrate. The first and/or fourth contact elements, which are arranged on the outer edge, are produced, for example, by metallically filled "vias" being arranged in a region of scribing and breaking trenches of the large substrate. Said vias are electrically connected to the electronic circuit on the first circuit carrier by conductor tracks. The vias are divided by scribing and breaking when singulating the large substrate into individual first circuit carriers. In the process, vias are severed, the metal core thereof is exposed and thus produces a metallic edge contact to the outside. Since the vias are filled, for example, with silver (Ag), the first and/or fourth contact elements can be protected after the singulating operation by means of a conductive paste, a conductive adhesive or a layer of solder.

In a further refinement of the control device according to the invention, the at least one second contact element, which is designed as a contact spring, is at least partially injected into an end wall of the housing. By means of the injection of the second contact elements, a moisture-proof connection between the control device and a plug receptacle can advantageously be produced.

In a further refinement of the control device according to the invention, a heat sink, which is arranged on the first circuit carrier, is provided. This embodiment is expedient whenever the heat sink has a low weight and the risk of the first circuit carrier sagging and/or vibrating should be virtually ruled out. The heat sink is fastened on the first circuit carrier in a customary manner, for example by adhesive bonding, and is designed to be narrower than the distance between the guide means. In this embodiment, the guidance is brought about solely by means of the first circuit carrier. As an alternative, the first circuit carrier is arranged on the heat sink which is guided in further guide means formed in the housing. The alternative embodiment is expedient whenever the heat sink has a high weight. In this embodiment, the cooling of the first circuit carrier or of the ceramic substrate can advantageously be transferred by adhesively bonding the circuit carrier or ceramic substrate onto the heat sink, with it being possible for the circuit carrier to be designed to be thinner than the heat sink. Said heat sink is mounted in the housing of the control device or is designed as part of the housing of the control device. In order to guide the heat sink in the further guide means, the heat sink is provided, for example, with springs which can be introduced into the guide means. Said springs of the heat sink are then introduced into the guide means in the housing in the above-described manner. For this purpose, the first circuit carrier is mounted on the heat sink with a small positional tolerance so as not to exceed the tolerances for striking the second contact elements, which are designed as spring contacts, and so as to avoid twisting of the first circuit carrier in the guide means thereof in relation to the heat sink in the guide means thereof. The heat sink is fixed to the housing by latching to the housing or by adhesive bonding, depending on requirements.

In a refinement of the method according to the invention, a second circuit carrier, guided in the guide means downstream of the first circuit carrier, is pushed in until it bears against the first circuit carrier, and at least one third contact element, which is designed as a contact spring and is arranged on the second circuit carrier, produces an electric connection to at least one corresponding fourth contact element of the first circuit carrier. In addition, with the pushing-in of the second circuit carrier, a second housing part can be joined together with the first housing part, the two housing parts being connected to each other at at least one connecting point. Depending on requirements, the two housing parts can be tightly adhesively bonded or simply latched together. In the mechanical stop, the third contact elements, which are injected, for example, into the second housing part or the second circuit carrier and are designed as spring contacts and are connected, for example, via punched grids, to the at least one separate component, which cannot be placed on the first circuit carrier, make contact with the electronic circuit of the first circuit carrier via the fourth contact elements, which are designed as contact surfaces.

Advantageous embodiments of the invention are illustrated in the drawings and are described below. In the drawings, the same reference numbers refer to components or elements which carry out identical or analog functions.

DETAILED DESCRIPTION

Figure 1:
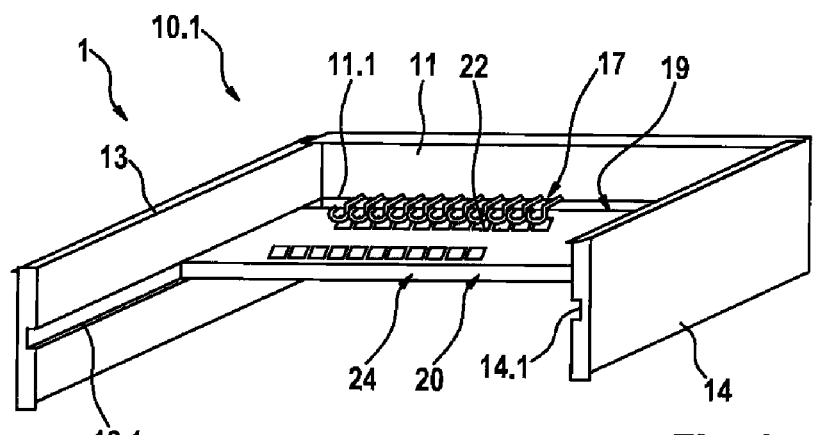
FIG. 1 shows a schematic perspective illustration of a first housing part of a first exemplary embodiment of a housing for a control device according to the invention.
Figure 2:
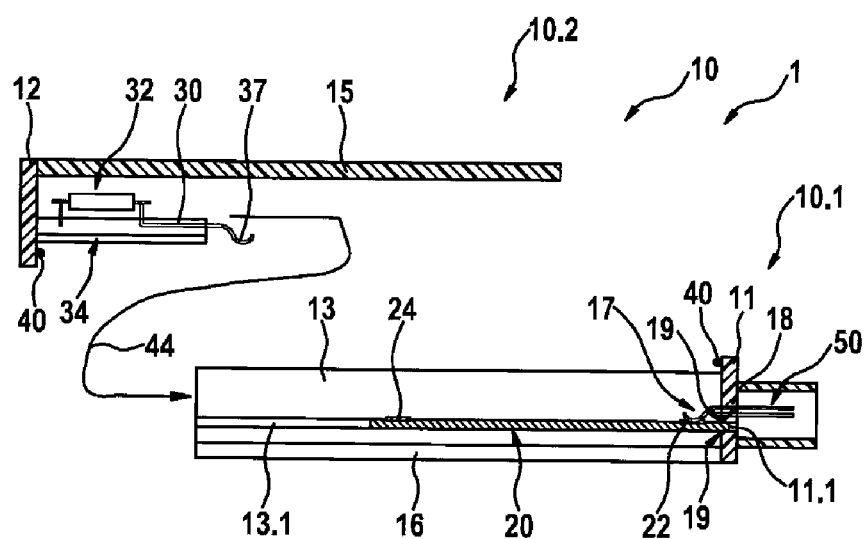
FIG. 2 shows a schematic side view of a partial sectional illustration of housing components of the first exemplary embodiment of the housing for a control device according to the invention.

As is apparent from FIGS. 1 and 2, a first exemplary embodiment of a plastics housing 10 for a control device 1 according to the invention for a motor vehicle comprises a first housing part 10.1 which comprises at least one front end wall 11, two side walls 13, 14 and a first circuit carrier 20, and a second housing part 10.2 which comprises a rear end wall 12, a housing cover 15 and a second circuit carrier 30. As is furthermore apparent from FIGS. 1 and 2, the front end wall 11 has receiving means 11.1, which are designed in the form of a receiving groove, for the first circuit carrier 20, and the two opposite housing side walls 13, 14 have guide means 13.1, 14.1, which are each designed in the form of a guide groove and into which the first circuit carrier 20 is guided. According to the invention, the guide means 13.1, 14.1 and/or receiving means 11.1 form a mechanical stop 19 for the first circuit carrier 20, which stop is designed in such a manner that the position of the first circuit carrier 20 in the mechanical stop 19 is fixed with a sufficiently small tolerance such that an electric connection is produced between at least one first contact element 22 of the first circuit carrier 20 and at least one corresponding second contact element 17 of a plug receptacle 50, which contact element is designed as a contact spring. As is furthermore apparent from FIGS. 1 and 2, a plurality of second contact elements 17 are guided in a leadthrough region 18 through the front end wall 11 and, in each case with corresponding first contact elements 22 designed as contact surfaces, produce an electric connection via which an electronic circuit, which is arranged on the first circuit carrier 20, can be electrically coupled to a cable harness arranged outside the control device 1 or to another electric control device. In the first exemplary embodiment illustrated, the second contact elements 17 in the plug receptacle 50 outside the housing 10 are designed as contact pins, are at least partially injected into the end wall 11 in the leadthrough region 18 and, on the inside, are designed as contact springs which rest on associated first contact elements 22 by means of spring force.

The guide means 13.1, 14.1 which are designed in the form of guide grooves are provided in the respective housing walls 13, 14 in such a manner that a tapered portion arises in the region upstream of the at least one second contact element 17, which is designed as a contact spring, said tapered portion fixing the lateral position of the first circuit carrier 20 with a sufficiently small tolerance in order to strike against the second contact elements 17, which are designed as spring contacts.

According to the method according to the invention for mounting the control device 1 for a motor vehicle, the first circuit carrier 20, guided in the guide means 13.1, 14.1 which are arranged on two opposite housing walls 13, 14, is pushed into the first housing part 10.1 in the direction of the front end wall 11 as far as the mechanical stop 19, the mechanical stop 19 for the first circuit carrier 20 being formed by receiving means 11.1 provided in the at least one housing wall 11 and/or by the guide means 13.1, 14.1. In this case, the position of the first circuit carrier 20 in the mechanical stop 19 is fixed with a sufficiently small tolerance such that the electric connection is produced between the at least one first contact element 22 and the corresponding second contact element 17, which is designed as a contact spring. An additional housing base 16 can subsequently be connected to the first housing part 10.2, for example by adhesive bonding or latching. As an alternative, the housing base 16 can already be connected to the first housing part 10.1 prior to the first circuit carrier 20 being pushed in and can therefore be, as it were, part of the first housing part 10.1.

A second circuit carrier 30, guided in the guide means 13.1, 14.1 downstream of the first circuit carrier 20, is subsequently pushed in until it bears against the first circuit carrier 20 corresponding to an introducing direction, which is illustrated by an arrow 44, in the direction of the front end wall 11, and at least one third contact element 37, which is designed as a contact spring and is arranged on the second circuit carrier 30, produces an electric connection with at least one corresponding fourth contact element 24 of the first circuit carrier 20. In the first exemplary embodiment illustrated, the third contact elements 37, which are designed as contact springs, are partially injected into the second circuit carrier 30. Corresponding tongues 34 are arranged on the second circuit carrier 30 for the introduction into the guide means 13.1, 14.1 and for guidance in the guide means 13.1, 14.1. The second circuit carrier 30 bears, for example, at least one separate component, for example an electrolytic capacitor, a power semiconductor, a coil, etc, which is intended to be electrically connected via the third and fourth contact elements 37, 24 to the electronic circuit arranged on the first circuit carrier 20. In the exemplary embodiment illustrated, the second circuit carrier 30 is designed as part of the second housing part 10.2, and therefore, when the second circuit carrier 30 is pushed in, the second housing part 10.2 is joined to the first housing part 10.1. Depending on requirements, the two housing parts 10.1, 10.2 are tightly adhesively bonded or simply latched to each other at corresponding connecting points 40.

Figure 3:
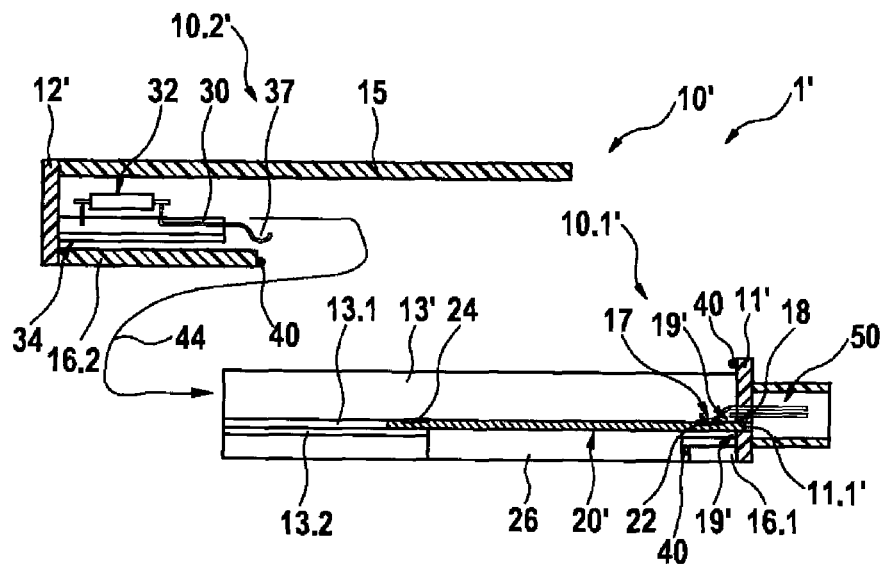
FIG. 3 shows a schematic side view of a partial sectional illustration of housing components of a second exemplary embodiment of a housing for a control device according to the invention.

As is apparent from FIG. 3, a second exemplary embodiment of a plastic housing 10' for a control device 1' according to the invention for a motor vehicle comprises, analogously to the first exemplary embodiment, a first housing part 10.1', which comprises at least one front end wall 11', two side walls, of which only one side wall 13 is visible, and a first circuit carrier 20', and a second housing part 10.2', which comprises a rear end wall 12', a housing cover 15 and a second circuit carrier 30. As is furthermore apparent from FIG. 3, the front end wall 11' has receiving means 11.1', which are designed in the form of a receiving groove, for the first circuit carrier 20', and the two opposite housing side walls 13 have guide means 13.1 which are each designed in the form of a guide groove and into which the first circuit carrier 20' is guided. In contrast to the first exemplary embodiment, in the second exemplary embodiment the first circuit carrier 20' is arranged on a heat sink 26 which is likewise guided in further guide means 13.2, which are designed in the form of guide grooves. According to the invention, guide means 13.1 and/or receiving means 11.1' form a mechanical stop 19' for the first circuit carrier 20', which is designed in such a manner that the position of the first circuit carrier 20' in the mechanical stop 19' is fixed with a sufficiently small tolerance such that an electric connection is produced between at least one first contact element 22 of the first circuit carrier 20' and at least one corresponding second contact element 17 of the plug receptacle 50, which second contact element is designed in the form of a contact spring. As is furthermore apparent from FIG. 3, analogously to the first exemplary embodiment a plurality of second contact elements 17 are guided in a leadthrough region 18 through the front end wall 11' and each produce an electric connection with corresponding first contact element 22, which are designed as contact surfaces, via which electric connection an electronic circuit arranged on the first circuit carrier 20' can be electrically coupled to a cable harness arranged outside the control device 1' or to another electric control device. Also in the second exemplary embodiment illustrated, the second contact elements 17 in the plug receptacle 50 outside the housing 10' are designed as contact pins, are at least partially injected into the end wall 11' in the leadthrough region 18 and, on the inside, are designed as contact springs which rest on associated first contact elements 22' by means of spring force.

The cooling of the first circuit carrier 20' or of the ceramic substrate can advantageously be transferred by the arrangement of the first circuit carrier 20' on the heat sink 26. In the second exemplary embodiment illustrated, the heat sink 26 is designed as part of the base of the housing 10' of the control device 1'. In order to guide the heat sink 26 in the further guide means 13.2, the heat sink 26 is provided, for example, with springs (not illustrated) which can be introduced into the further guide means 13.2. Said springs of the heat sink 26 are then introduced in the above-described manner into the further guide means 13.2 in the housing 10'. For this purpose, the first circuit carrier 20' is mounted with a small positional tolerance on the heat sink 26 so as not to exceed the tolerances for striking against the second contact elements 17, which are designed as spring contacts, and so as to avoid twisting of the first circuit carrier 20' in the guide means 13.1 thereof in relation to the heat sink 26 in the guide means 13.2 thereof. In the second exemplary embodiment illustrated, a first base part 16.1 is connected to the first housing part 10.1'. As an alternative, the first circuit carrier 20' can be designed to be narrower than the heat sink 26 such that the guidance is carried out only by the heat sink 26 in the further guide means 13.2. In the case of such an embodiment, the further guide means 13.2 take on the functions of the guide means 13.1, and therefore the guide means 13.1 can be omitted.

According to the method according to the invention for mounting the control device 1' for a motor vehicle, the heat sink 26 with the first circuit carrier 20', guided in the guide means 13.1, 13.2, which are arranged on two opposite housing walls, only one housing wall 13' of which is visible, is pushed into the first housing part 10.1' in the direction of the front end wall 11' as far as the mechanical stop 19', the mechanical stop 19' for the first circuit carrier 20' being formed by receiving means 11.1' provided in the at least one housing wall 11' and/or by the guide means 13.1. In this case, the position of the first circuit carrier 20' in the mechanical stop 19' is fixed with a sufficiently low tolerance such that the electric connection is produced between the at least one first contact element 22' and the corresponding second contact element 17, which is designed as contact spring. At the same time, the heat sink 26 comes to bear against the first base part 16.1 and is connected to the latter at a connecting point 40, for example by adhesive bonding or latching, such that the heat sink 26 forms part of the housing base.

Subsequently, a second circuit carrier 30', guided in the guide means 13.1 downstream of the first circuit carrier 20', is pushed in in the direction of the front end side 11' corresponding to an introducing direction, which is illustrated by an arrow 44, until it bears against the first circuit carrier 20', and, analogously to the first exemplary embodiment, at least one third contact element 37, which is designed as a contact spring and is arranged on the second circuit carrier 30, produces an electric connection with at least one corresponding fourth contact element 24 on the first circuit carrier 20. Also in the second exemplary embodiment illustrated, the third contact elements 37, which are designed as contact springs, are partially injected into the second circuit carrier 30. Corresponding tongues 34 are arranged on the second circuit carrier 30 for the introduction into the guide means 13.1 and/or the guidance in the guide means 13.1. The second circuit carrier 30 bears, for example, at least one separate component which is intended to be electrically connected via the third and fourth contact elements 37, 24 to the electronic circuit arranged on the first circuit carrier 20'. Also in the second exemplary embodiment illustrated, the second circuit carrier 30 is designed as part of the second housing part 10.2', which additionally has a second base part 16.2, and therefore, when the second circuit carrier 30 is pushed in, the second housing part 10.2' is joined to the first housing part 10.1' and to the heat sink 26. Depending on requirements, the two housing parts 10.1', 10.2' are tightly adhesively bonded or simply latched to each other at corresponding connecting points 40.

Figure 4:
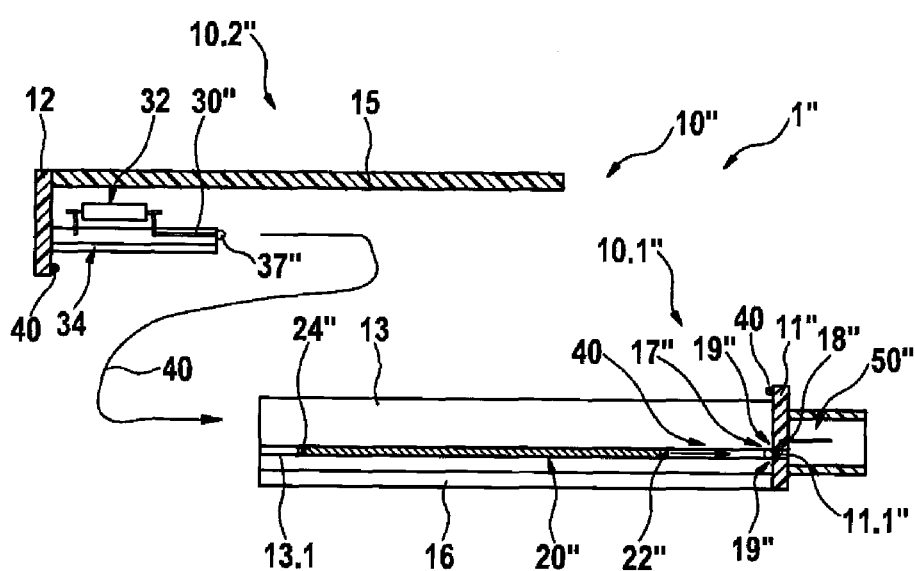
FIG. 4 shows a schematic side view of a partial sectional illustration of housing components of a third exemplary embodiment of a housing for a control device according to the invention.
Figure 5:
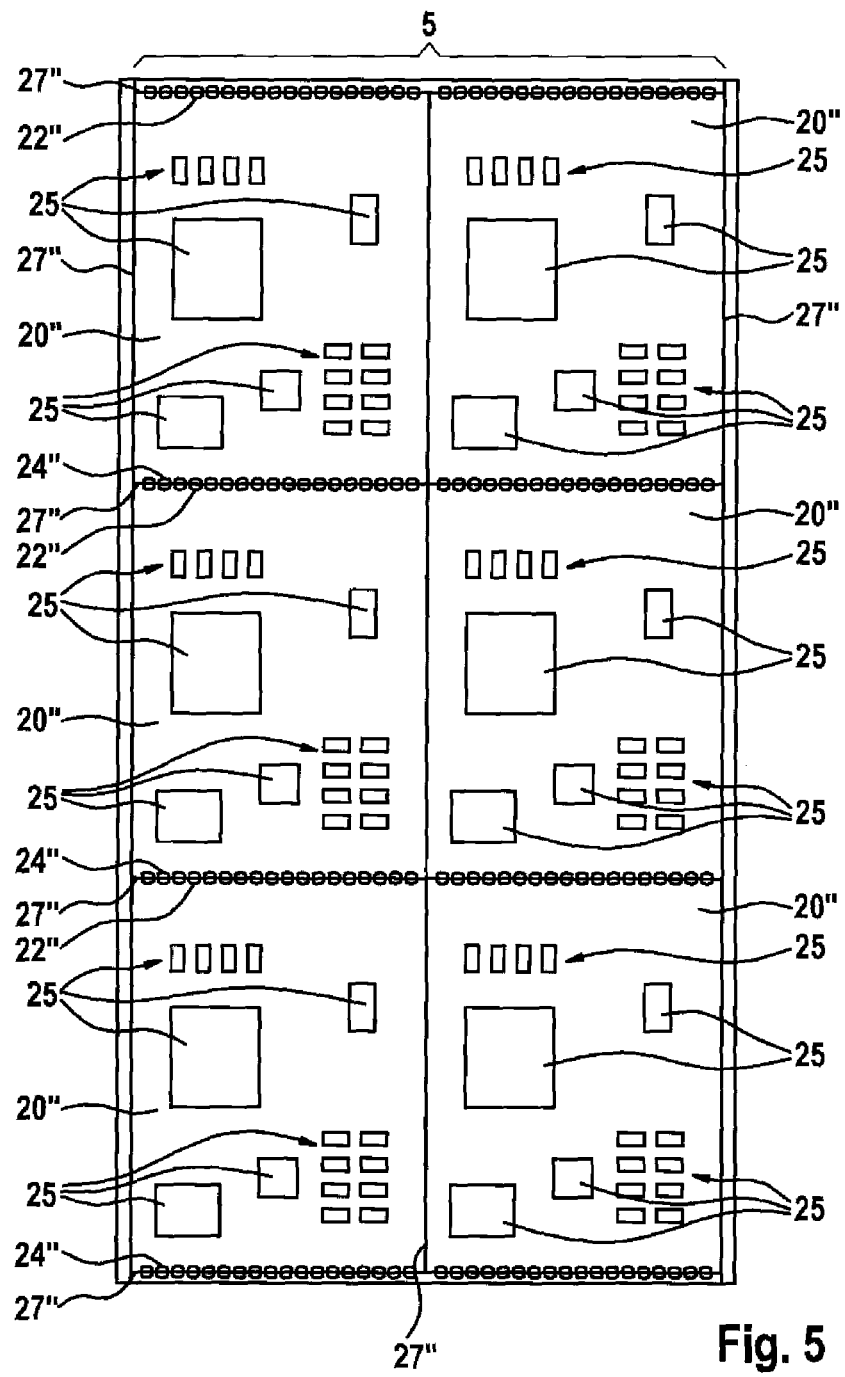
FIG. 5 shows a schematic top view of a large substrate with a plurality of first circuit carriers.
Figure 6:
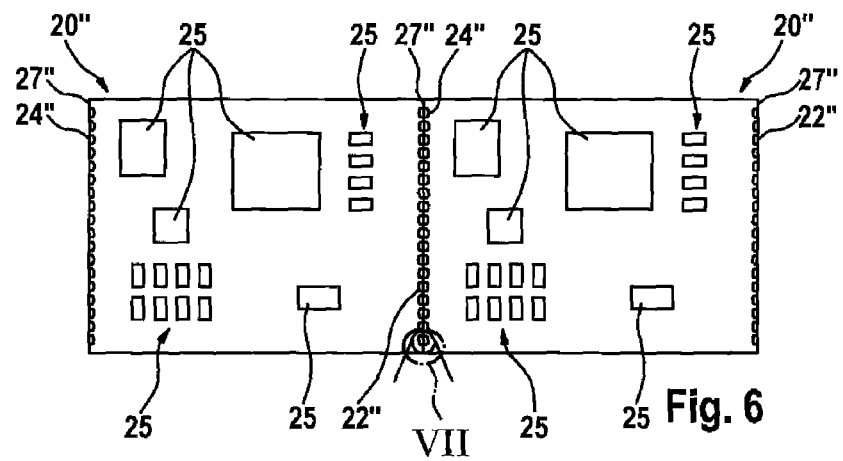
FIG. 6 shows a schematic top view of two first circuit carriers which are still connected, prior to a separating operation.
Figure 7:
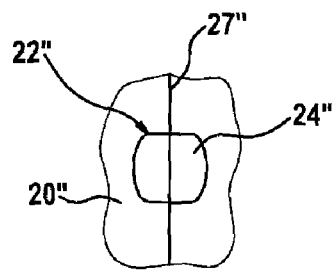
FIG. 7 shows a schematic illustration of a detail from FIG. 6.
Figure 8:
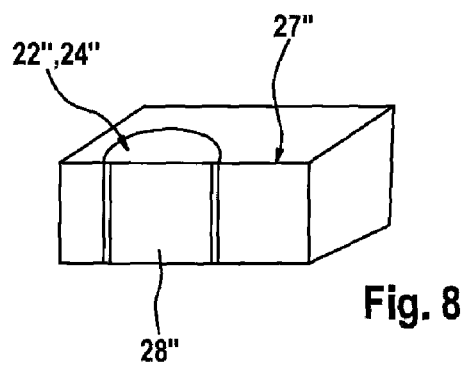
FIG. 8 shows a schematic perspective illustration of a detail of a contact element.

As is apparent from FIG. 4, a third exemplary embodiment of a plastics housing 10" for a control device 1" according to the invention for a motor vehicle comprises, analogously to the first exemplary embodiment, a first housing part 10.1", which comprises at least one front end wall 11", two side walls, only one side wall 13 of which is visible, and a first circuit carrier 20", and a second housing part 10.2", which comprises a rear end wall 12, a housing cover 15 and a second circuit carrier 30". As is furthermore apparent from FIG. 4, the third exemplary embodiment substantially corresponds to the first exemplary embodiment, apart from the contact connections, and therefore a repetitive description of components which are already known is omitted. In contrast to the first exemplary embodiment, the first and/or fourth contact elements 22", 24", which are designed as contact surfaces, are arranged on the outer edge of the first circuit carrier 20". This embodiment of the first and/or fourth contact elements is described in detail below with reference to FIGS. 5 to 8. By means of the arrangement on the outer edge of the first circuit carrier 20", the embodiments of the second and third contact elements 17" and 37" as spring elements are also correspondingly shortened and adapted. The second contact elements 17", which are designed as spring elements, are thus arranged, for example, in the receiving means 11.1", which are designed in the form of a receiving groove, and therefore that part of the second contact element 17" which is encapsulated by injection molding and the leadthrough region 18" turn out to be correspondingly smaller. In addition, the arrangement of the contact pins in the plug receptacle 50" can also be changed.

According to the method according to the invention for mounting the control device 1" for a motor vehicle, the first circuit carrier 20", guided in the guide means 13.1 which are arranged in two opposite housing walls, only one housing wall 13 of which is visible, is pushed into the first housing part 10.1" in the direction of the front end wall 11" as far as the mechanical stop 19", the mechanical stop 19" for the first circuit carrier 20" being formed by receiving means 11.1" provided in the at least one housing wall 11" and/or by the guide means 13.1. In this case, the position of the first circuit carrier 20" in the mechanical stop 19" is fixed with a sufficiently small tolerance such that the electric connection is produced between the at least one first contact element 22" and the corresponding second contact element 17", which is designed as a contact spring. Subsequently, an additional housing base 16 can be connected to the first housing part 10.2", for example by adhesive bonding or latching. As an alternative, the housing base 16 can already be connected to the first housing part 10.1" before the first circuit carrier 20" is pushed in, and can therefore be, as it were, part of the first housing part 10.1".

A second circuit carrier 30", guided in the guide means 13.1 downstream of the first circuit carrier 20", is subsequently pushed in in the direction of the front end wall 11" corresponding to an introducing direction, which is illustrated by an arrow 44, until it bears against the first circuit carrier 20", and at least one third contact element 37", which is designed as a contact spring and is arranged on the second circuit carrier 30", produces an electrical connection with at least one corresponding fourth contact element 24" of the first circuit carrier 20". Also in the third exemplary embodiment illustrated, the third contact elements 37", which are designed as contact springs, are partially injected into the second circuit carrier 30". Corresponding tongues 34 are arranged on the second circuit carrier 30" for the introduction into the guide means 13.1 and for the guidance in the guide means 13.1. The second circuit carrier 30" bears, for example, at least one separate component which is intended to be electrically connected via the third and fourth contact elements 37", 24" to the electronic circuit arranged on the first circuit carrier 20". Also in the third exemplary embodiment illustrated, the second circuit carrier 30" is designed as part of the second housing part 10.2", and therefore, when the second circuit carrier 30" is pushed in, the second housing part 10.2" is joined to the first housing part 10.1". Depending on requirements the two housing parts 10.1", 10.2" are tightly adhesively bonded or simply latched to each other at corresponding connecting points 40.

As is apparent from FIGS. 5 to 8, the first and/or fourth contact elements 22", 24", which are arranged on the outer edge of the respective first circuit carrier 20" and are designed as contact surfaces, are formed by metallically filled vias which are arranged on a large substrate 5 in such a manner that they are divided when singulating the first circuit carriers 20" from the large substrate 5. As is apparent from FIG. 5, in the exemplary embodiment illustrated the large substrate 5 comprises six first circuit carriers 10" which are fitted with corresponding electronic components 25 which form, for example, an electronic circuit. The individual first circuit carriers 20" are separated from one another by a plurality of vertical and horizontal scribing and breaking trenches 27". Metallically filled "vias" 22", 24" are arranged on the horizontal scribing and breaking trenches 27" and on the scribing and breaking trenches 27" which form the end sides of the first circuit carrier 20". Said vias 22", 24" are electrically connected by conductor tracks (not illustrated) to the electronic circuit and to the components 25. They are divided by scribing and breaking upon singulating of the large substrate 5 into the individual first circuit carrier 20". In the process, the vias 22", 24" are severed and the associated metal core is exposed, and therefore the metallic edge contacts 22", 24" are produced to the outside. Since the vias are filled, for example, with silver (Ag), the edge contacts 22", 24" are protected by means of a conductive paste, a conductive glue or a layer of solder 28" after the singulating operation.

Embodiments of the invention permit cost-saving contact connection of a ceramic circuit carrier within the course of the joining of the components of the control device, and therefore a short cycle time can be used and investments for the wire contact connection means can be saved. In addition, embodiments of the invention advantageously enable the system to be capable of modular construction with regard to different circuit carrier sizes, thermal requirements and different customer plugs. Embodiments of the invention are based on contacting technology, in which the circuit carrier or the ceramic substrate is pushed into guide grooves of a plastics housing and are connected in the mechanical stop to the customer plug via spring contacts injected into the plastics material of the housing. The guide grooves taper in the region upstream of the spring contacts on the mechanical stop in such a manner that the lateral position of the ceramic circuit carrier is fixed with a sufficiently small tolerance in order to strike against the spring contacts. After the circuit carrier has been pushed into the housing and connected, the cover part of the housing is pushed in the same manner into the guide groove and, depending on requirements, is tightly adhesively bonded or simply latched to the housing. In the mechanical stop, the spring contacts, which are injected into the cover part and are connected via punched grids to separate components which cannot be placed on the ceramic substrate, likewise make contact with contacts of the circuit carrier or of the ceramic substrate. For control devices, the ceramic substrate of which generates an increased loss of power, it is possible to adhesively bond the circuit carrier or the substrate onto a heat sink which is likewise provided with a spring which can be introduced into the housing groove.

What is claimed is:

1. A control device for a motor vehicle, with a housing (10, 10', 10") and at least one circuit carrier (20, 20', 20"), which is arranged in an interior space of the housing (10, 10', 10") and has at least one first contact element (22, 22") which, adjacent at least one housing wall (11, 11', 11"), produces an electric connection to at least one second contact element (17, 17") of a plug receptacle (50, 50"), wherein the at least one second contact element (17, 17") is guided through the at least one housing wall (11, 11', 11") and is a contact spring which bears against the at least one first contact element (22, 22") by means of spring force, characterized in that the at least one housing wall (11, 11', 11") has receiving means (11.1, 11.1', 11.1") to receive a first of the at least one circuit carrier (20, 20', 20"), the first circuit carrier (20, 20', 20") being guided by guide means (13.1, 14.1) formed in the housing (10, 10', 10"), at least one of the guide means (13.1, 14.1) and the receiving means (11.1, 11.1', 11.1") forming a mechanical stop (19, 19', 19") for the first circuit carrier (20, 20', 20"), wherein the position of the first circuit carrier (20, 20', 20") in the mechanical stop (19, 19', 19") is fixed with a sufficiently small tolerance such that the electric connection is positioned between the at least one first contact element (22, 22") of the first circuit carrier (20, 20', 20") and the corresponding at least one second contact element (17, 17") of the plug receptacle (50, 50");

wherein a second of the at least one circuit carrier (30, 30") is guided in the guide means (13.1, 14.1) adjacent the first circuit carrier (20, 20', 20"), at least one third contact element (37, 37"), which is a contact spring, being arranged on the second circuit carrier (30, 30") and producing an electric connection to at least one corresponding fourth contact element (24, 24") of the first circuit carrier (20, 20', 20"); and wherein at least one of the at least one first contact element (22, 22") and the at least one fourth contact element (24, 24") is a contact surface which is arranged on one of a surface of the first circuit carrier (20, 20') and an outer edge of the first circuit carrier (20") that is opposite the at least one housing wall (11, 11', 11") and the at least one first contact element (22, 22").

2. The control device as claimed in claim 1, wherein the guide means (13.1, 14.1) are guide grooves which are each provided in a housing wall (13, 14) and that taper in a direction toward the at least one housing wall (11, 11', 11").

3. The control device as claimed in claim 1, wherein at least one of the first and fourth contact elements (22", 24"), which are arranged on the outer edge and are contact surfaces, are formed by metallically filled vias which are arranged on a large substrate (5) in such a manner that they can be divided when the first circuit carrier (20") is cut out of the large substrate (5).

4. The control device as claimed in claim 1, wherein the at least one second contact element (17, 17"), which is a contact spring, is at least partially injected into an end wall (11) of the housing (10).

5. The control device as claimed in claim 1, wherein a heat sink (26) is arranged on the first circuit carrier (20').

6. The control device as claimed in claim 1, wherein the first circuit carrier (20') is arranged on a heat sink (26) which is guided in further guide means (13.2) formed in the housing.

7. A method for mounting a control device for a motor vehicle, which has a housing (10, 10', 10") and at least one circuit carrier (20, 20', 20"), which is arranged in an interior space of the housing (10, 10', 10") and has at least one first contact element (22, 22") which, adjacent least one housing wall (11, 11', 11"), produces an electric connection to at least one second contact element (17, 17") of a plug receptacle (50, 50"), wherein the at least one second contact element (17, 17") is guided through the at least one housing wall (11, 11', 11") and, is a contact spring which bears against the at least one first contact element (22, 22") by means of spring force, characterized in that a first of the at least one circuit carrier (20, 20', 20"), guided by guide means (13.1, 14.1) formed in the housing (10, 10', 10"), is pushed into a first housing part (10.1) as far as a mechanical stop (19, 19', 19"), the mechanical stop (19, 19', 19") for the first circuit carrier (20, 20', 20") being formed by at least one of receiving means (11.1, 11.1', 11.1") in the at least one housing wall (11, 11', 11") and the guide means (13.1, 14.1), the position of the first circuit carrier (20, 20', 20") in the mechanical stop (19, 19', 19") being fixed with a sufficiently small tolerance such that the electric connection is positioned between the at least one first contact element (22, 22") and the corresponding at least one second contact element (17, 17");

wherein a second of the at least one circuit carrier (30, 30") is formed in a second housing part (10.2), is guided in the guide means (13.1, 14.1), and is pushed in until it bears against the first circuit carrier (20, 20', 20"), and at least one third contact element (37, 37"), which is a contact spring and is arranged on the second circuit carrier (30, 30"), produces an electric connection to at least one corresponding fourth contact element (24, 24") of the first circuit carrier (20, 20', 20"); and wherein with the pushing-in of the second circuit carrier (30, 30"), the second housing part (10.2) is joined together with the first housing part (10.1), the two housing parts being connected to each other at at least one connecting point (40) for electrical connection.

8. The method of claim 7, further comprising forming the guide means (13.1, 14.1) as guide grooves which are each provided in a housing wall (13, 14) and that taper in a direction toward the at least one housing wall (11, 11', 11").

9. The method of claim 7, further comprising filling vias on a substrate (5) with metal to form at least one of the first and fourth contact elements (22", 24").

10. The method of claim 7, further comprising injecting the least one second contact element (17, 17") into an end wall (11) of the housing (10).

\* \* \* \* \*